(12) United States Patent
Woolsey

(10) Patent No.: US 12,422,454 B2
(45) Date of Patent: Sep. 23, 2025

(54) TERMINAL BLOCK TEST ADAPTER

(71) Applicant: Cameron Woolsey, Surprise, AZ (US)

(72) Inventor: Cameron Woolsey, Surprise, AZ (US)

( * ) Notice: Subject to any disclaimer, the term of this patent is extended or adjusted under 35 U.S.C. 154(b) by 179 days.

(21) Appl. No.: 18/510,844

(22) Filed: Nov. 16, 2023

(65) Prior Publication Data
US 2025/0164524 A1    May 22, 2025

(51) Int. Cl.
*G01R 1/04*    (2006.01)
*G01R 1/20*    (2006.01)

(52) U.S. Cl.
CPC ............. *G01R 1/0416* (2013.01); *G01R 1/20* (2013.01)

(58) Field of Classification Search
None
See application file for complete search history.

(56) References Cited

U.S. PATENT DOCUMENTS

| | | | | |
|---|---|---|---|---|
| 2,435,136 A | * | 1/1948 | Gardenhour | H01R 29/00 439/44 |
| 3,813,642 A | * | 5/1974 | Fisher | H01H 25/06 439/43 |
| 7,271,357 B2 | * | 9/2007 | Ostmeier | H01R 13/71 200/51.09 |
| 7,666,037 B2 | * | 2/2010 | Diessel | H01R 13/7034 439/94 |
| 9,069,011 B2 | * | 6/2015 | Walcher | G01R 1/0408 |
| 9,797,952 B2 | * | 10/2017 | Ostmeier | G01R 31/3272 |

* cited by examiner

*Primary Examiner* — Richard Isla
(74) *Attorney, Agent, or Firm* — Bruce A. Lev

(57) ABSTRACT

A terminal block test adapter releasably attached to a terminal block for releasably connecting electrical wires thereto without breaking or shorting current flowing through the terminal block. The terminal block test adapter includes a plurality of spring biased connector posts within post housings adapted to be linearly aligned with connector posts within post housings of the terminal block. When in use, a proximal end of each connector post of the terminal block test adapter is adapted to be used for releasably connecting a test wire thereto for electrical testing purposes without breaking or shorting current flowing through the terminal block.

9 Claims, 5 Drawing Sheets

TERMINAL BLOCK TEST ADAPTER

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR 1.71(d).

BACKGROUND OF THE INVENTION

1. Field of the Invention

This invention relates generally to CT shorting terminal blocks, and more specifically to a test adapter for CT shorting terminal blocks for circuit terminal testing.

2. Description of the Related Art

Prior art CT shorting terminal blocks are tested by connecting electrical wires to terminal posts thereof. The problem exists when the existing wires of the CT shorting terminal blocks are disconnected to connect testing wires thereto resulting in the interruption of electric current passing therethrough and possible arc flashing and electrocution of a person performing testing thereon. Accordingly, the present invention overcomes the disadvantages associated with the prior art, by providing a terminal block test adapted to be releasably attached to a terminal block for releasably connecting electrical wires thereto without breaking or shorting current flowing through the circuit terminal.

BRIEF SUMMARY OF THE INVENTION

In view of the foregoing disadvantages inherent in the known types of CT shorting terminal block testers or the like in the prior art, the present invention provides a terminal block test adapter adapted to be releasably attached to a terminal block for releasably connecting electrical wires thereto without breaking or shorting current flowing through the terminal block. The terminal block test adapter includes a plurality of spring biased connector posts within post housings adapted to be linearly aligned with connector posts within post housings of the terminal block. When in use, a proximal end of each connector post of the terminal block test adapter is adapted to be used for releasably connecting a test wire thereto for electrical testing purposes without breaking or shorting current flowing through the terminal block, with all the advantages of the prior art and none of the disadvantages.

There has thus been outlined, rather broadly, the more important features of the invention in order that the detailed description thereof that follows may be better understood and in order that the present contribution to the art may be better appreciated.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawings. The invention is capable of other embodiments and of being practiced and carried out in various ways. Also, it is to be understood that the phraseology and terminology employed herein are for the purpose of descriptions and should not be regarded as limiting.

BRIEF DESCRIPTION OF THE DRAWINGS

The figures which accompany the written portion of this specification illustrate embodiments according to the teachings of the present invention.

The various embodiments of the present invention will hereinafter be described in conjunction with the appended drawings.

DETAILED DESCRIPTION

The embodiments of the present disclosure described below are not intended to be exhaustive or to limit the disclosure to the precise forms disclosed in the following detailed description. Rather, the embodiments are chosen and described so that others skilled in the art may appreciate and understand the principles and practices of the present disclosure.

The following embodiments and the accompanying drawings, which are incorporated into and form part of this disclosure, illustrate embodiments of the invention and together with the description, serve to explain the principles of the invention. To the accomplishment of the foregoing and related ends, certain illustrative aspects of the invention are described herein in connection with the following description and the annexed drawings. These aspects are indicative, however, of but a few of the various ways in which the principles of the invention can be employed and the subject invention is intended to include all such aspects and their equivalents. Other advantages and novel features of the invention will become apparent from the following detailed description of the invention when considered in conjunction with the drawings.

Figure 1:
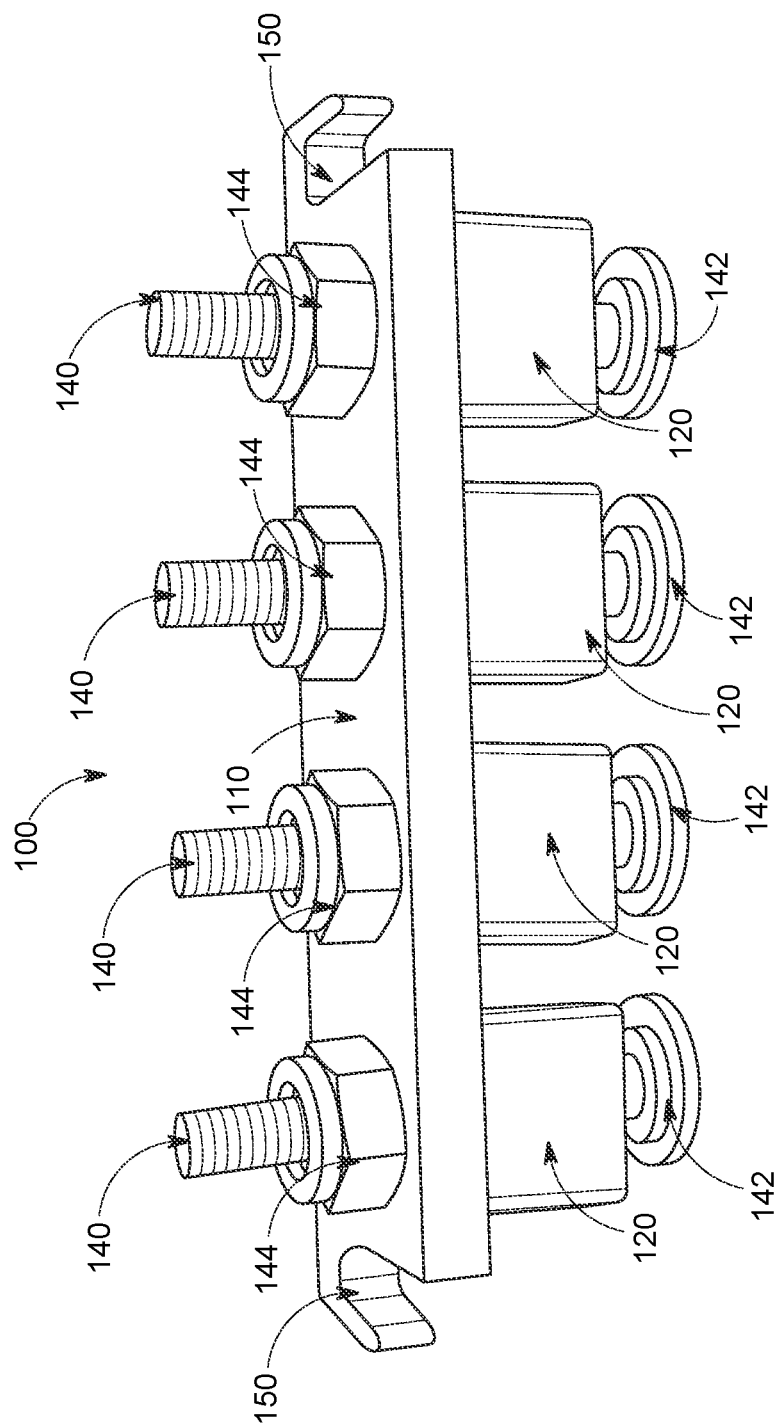
FIG. 1 shows a perspective view of the terminal block test adapter according to the preferred embodiment of the present invention.
Figure 2:
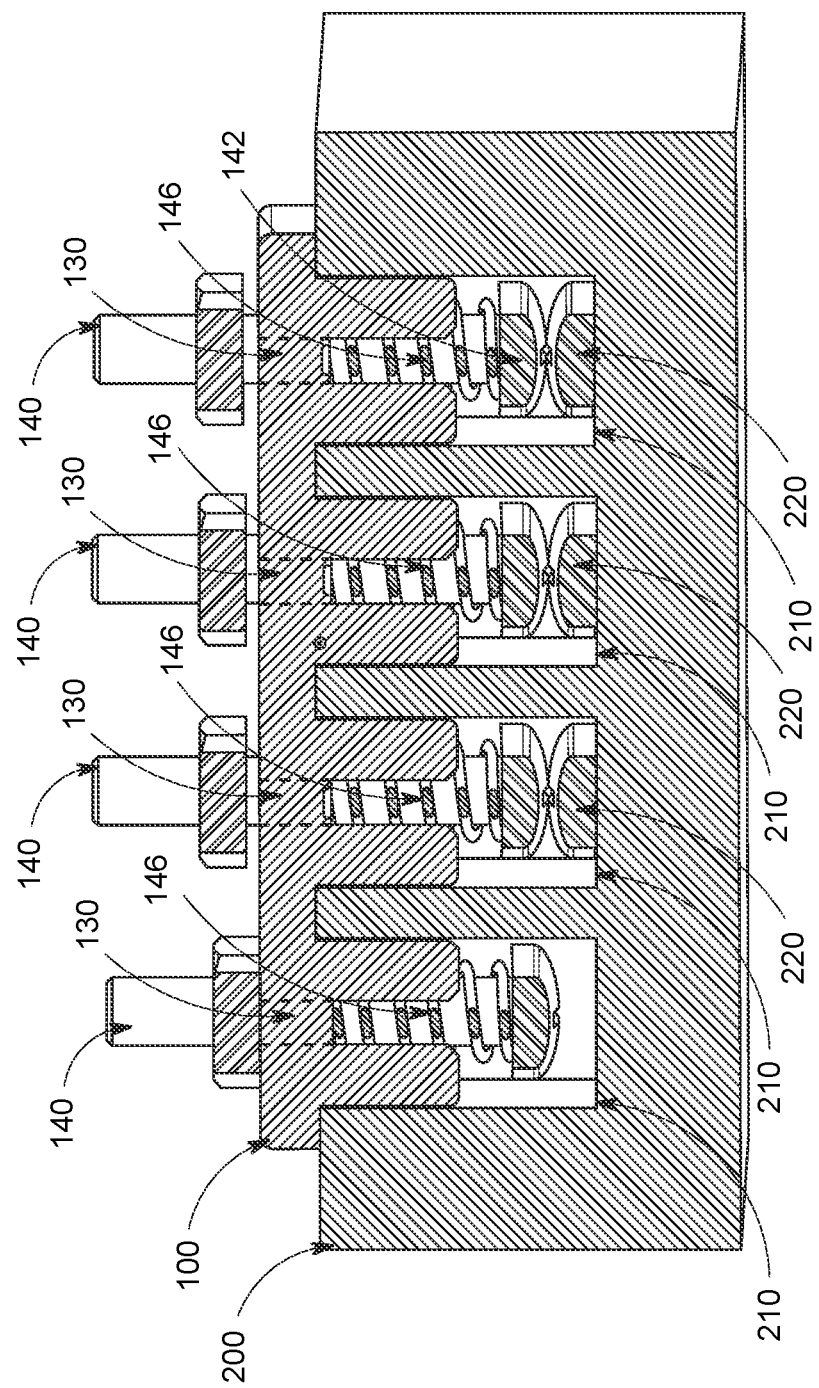
FIG. 2 shows a side cutaway view of the terminal block test adapter attached to a terminal block according to the preferred embodiment of the present invention of FIG. 1.
Figure 3A:
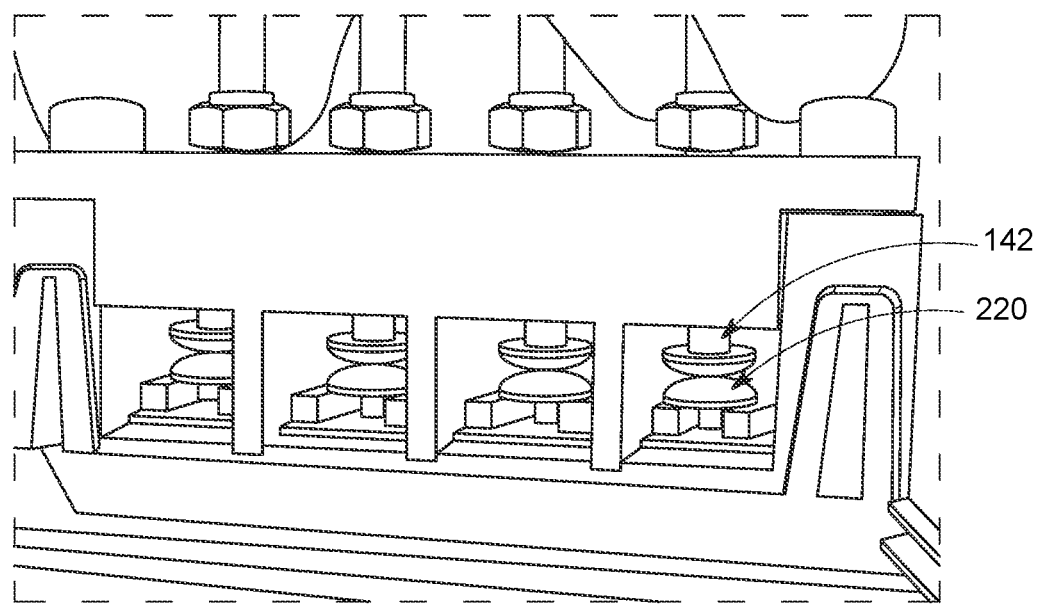
FIG. 3a shows a side view of the terminal block test adapter attached to a terminal block with all post heads in contact with post heads of the circuit terminal according to the preferred embodiment of the present invention of FIG. 1.
Figure 3B:
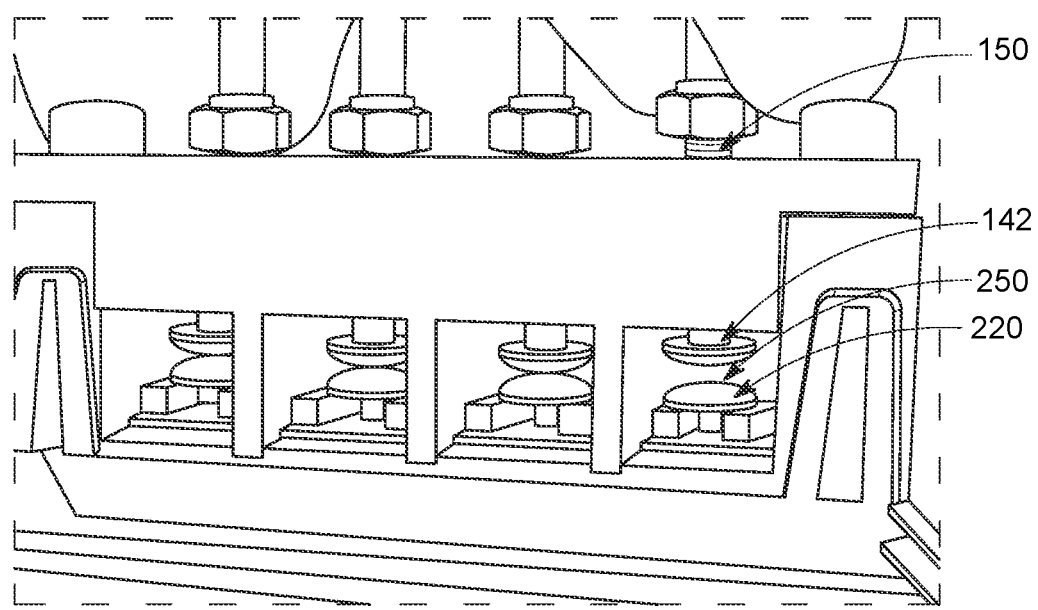
FIG. 3b shows a side view of the terminal block test adapter attached to a terminal block with three post heads in contact with three post heads of the terminal block, and a far right post head of the terminal block test adapter disconnected from the respective post head of the terminal block according to the preferred embodiment of the present invention of FIG. 1.
Figure 4:
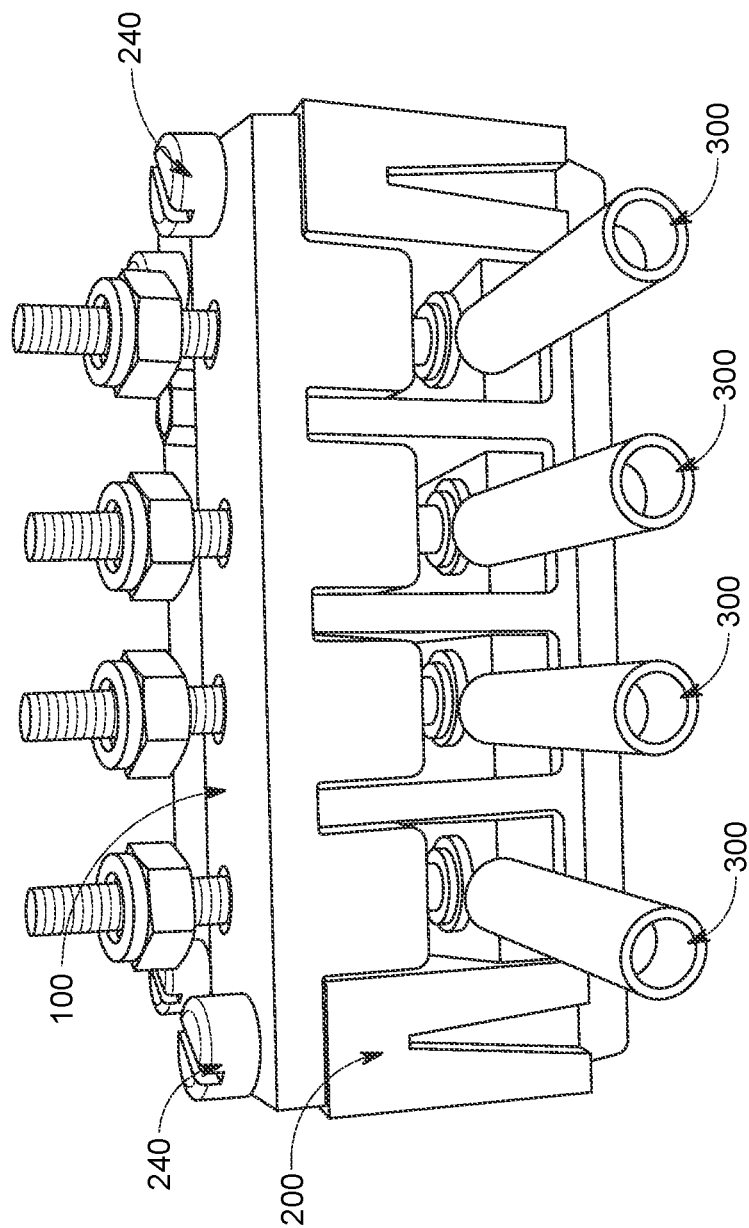
FIG. 4 shows a perspective view of the terminal block test adapter attached to a terminal block with electrical wires attached to the post heads of the terminal block according to the preferred embodiment of the present invention of FIG. 1.
Figure 5:
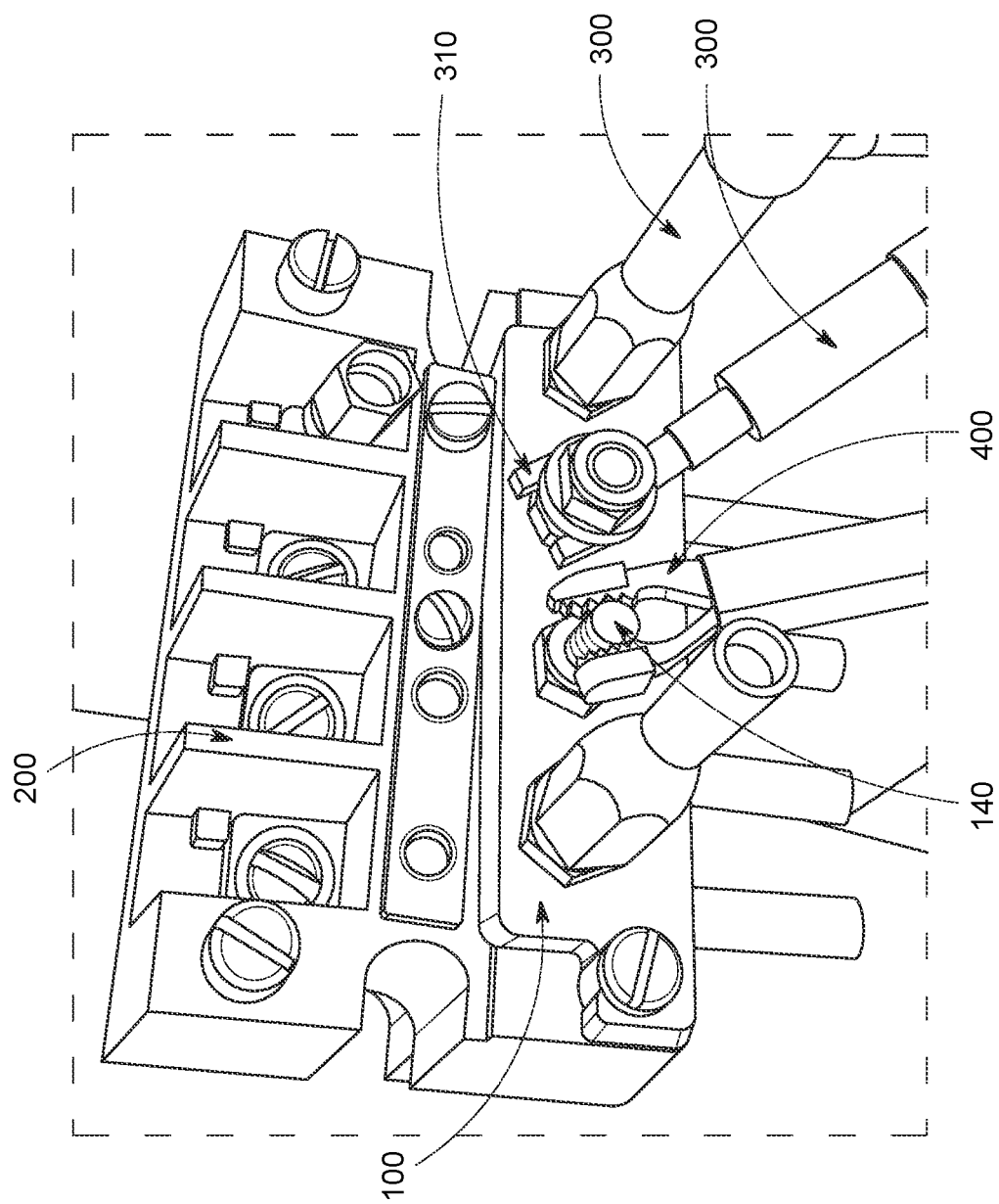
FIG. 5 shows a perspective view of the proximal ends of the biased posts of the terminal block test adapter having electric test wires releasably connected thereto according to the preferred embodiment of the present invention of FIG. 1.

Turning now descriptively to drawing, referring to FIGS. 1-5, the present invention discloses a combination of a terminal block 200 and a terminal block test adapter 100, comprising a terminal block 200 including a housing having a plurality of post housings 210, a plurality of posts each including a head 220 thereon and located within a respective one of the plurality of post housings 210, and two connector posts 240 located on spaced locations upon an upper surface of the housing; and a terminal block test adapter 100 comprising a main body 110 including a plurality of post housings 120 each including a post aperture 130 therethrough, are linearly aligned, and adapted to align with the post housings 210 of the terminal block 200, and a plurality of biased posts 140 each including an elongated threaded shaft, a head 142 located at a distal end of the threaded shaft, a threaded nut 144 adapted to movably engage the threaded shaft, and a spring 146 adapted to be located upon the threaded shaft adjacent the head, wherein the plurality of biased posts 140 are each located within respective post housings 120 of the terminal block test adapter 100 and through their respective post apertures 130, wherein each spring is located upon a respective threaded bolt of the plurality of biased posts and in between each respective head thereof and a bottom surface of each respective post housings to thereby resiliently house each of the plurality of biased posts within each respective post housings, and wherein each threaded nut is located in proximity to a respective distal end of each respective elongated threaded shaft and in between the respective distal end and an upper surface of each post housing.

When in use, the terminal block test adapter 100 is releasably attached to the terminal block 200 via the two connector posts 240 of the terminal block, the plurality of post housings 120 of the the terminal block test adapter 100 are linearly aligned with the post housings 210 of the terminal block 200, and each head 142 of each respective plurality of biased posts 140 are adapted to be in contact with a respective head 220 of a respective post of the terminal block 200. And wherein when in use, each proximal end of each threaded bolt of the terminal block test adapter is adapted to be used for releasably connecting a test wire 300 thereto for electrical testing purposes without breaking or shorting current flowing through said terminal block. As an example, in FIG. 5, an alligator clip connector 400 is used to connect test wire 300 to biased posts 140, and a forked connector 310 is sandwiched between threaded nut 144 and another threaded nut to connect another test wire 300 to another biased post 140.

The main body 110 of the terminal block test adapter 100 further includes a hook portion 150 on each opposite end thereof, each adapted to engage with a respective connector post 240 located on the spaced locations of the terminal block 200.

The main body 110 of the terminal block test adapter 100 is formed from a non-conductive material, while the plurality of biased posts 140 are formed from a conductive material. And, the main body 110 of the terminal block test adapter 100 and the terminal block 200 are formed having a substantially rectangular shapes.

One of the most important aspects of the instant invention is that the springs 146 of the biased posts 140 ensure that the connection between the post heads 142 of the terminal block test adapter 100 remain in constant contact with post heads 220 of the terminal block 200. The prior art does not have this feature nor perform that function. As such, the instant invention is much safer and a great improvement over the prior art.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention.

Although the invention has been explained in relation to its preferred embodiment, it is to be understood that many other possible modifications and variations can be made without departing from the spirit and scope of the invention.

What is claimed is:

1. A terminal block test adapter comprising:
   a main body including:
      a plurality of post housings, each including:
         a post aperture therethrough;
         wherein said plurality of post housings are linearly aligned and adapted to align with post housings of a terminal block; and
      a hook portion on each opposite end thereof, each adapted to engage with a respective connector post located on spaced locations of said terminal block; and
   a plurality of biased posts, each including:
      an elongated threaded shaft;
      a head located at a distal end of said threaded shaft;
      a threaded nut adapted to movably engage said threaded shaft; and
      a spring adapted to be located upon said threaded shaft adjacent said head;
   wherein said plurality of biased posts are each located within respective said plurality of post housings and through respective said post apertures;
   wherein each said spring is located upon a respective threaded bolt of said plurality of biased posts and in between each respective head thereof and a bottom surface of each respective said plurality of post housings to thereby resiliently house each of said plurality of biased posts within each respective said plurality of post housings;
   wherein each said threaded nut is located in proximity to a respective distal end of each respective said elongated threaded shaft and in between said respective distal end and an upper surface of each respective said plurality of post housings; and
   wherein, when in use, said terminal block test adapter is adapted to be releasably attached to a terminal block, said plurality of post housings adapted to be linearly aligned with post housings of said terminal block, and each said head of each respective plurality of biased posts are adapted to be in contact with a respective head of a respective post of each said post housing of said terminal block; and
   wherein, when in use, each said proximal end of each said threaded bolt is adapted to be used for releasably connecting a test wire thereto for electrical testing purposes without breaking or shorting current flowing through said terminal block.

2. The terminal block test adapter of claim 1, wherein said main body is formed from a non-conductive material.

3. The terminal block test adapter of claim 1, wherein said plurality of biased posts are formed from a conductive material.

4. The terminal block test adapter of claim 1, wherein said main body is formed having a substantially rectangular shape.

5. A combination of a terminal block and a terminal block test adapter, comprising:
   a terminal block including:
      a housing including:
         a plurality of post housings;
         a plurality of posts;

wherein each of said plurality of posts includes a head thereon; and wherein each of said plurality of posts is located within a respective one of said plurality of post housings: and two connector posts;

wherein said two connector posts are located on spaced locations upon an upper surface of said housing; and a terminal block test adapter comprising:
a main body including:
a plurality of post housings, each including:
a post aperture therethrough;
wherein said plurality of post housings are linearly aligned and adapted to align with said post housings of said terminal block; and
a plurality of biased posts, each including:
an elongated threaded shaft;
a head located at a distal end of said threaded shaft;
a threaded nut adapted to movably engage said threaded shaft; and
a spring adapted to be located upon said threaded shaft adjacent said head;
wherein said plurality of biased posts are each located within respective said plurality of post housings of said terminal block test adapter and through respective said post apertures;
wherein each said spring is located upon a respective threaded bolt of said plurality of biased posts and in between each respective head thereof and a bottom surface of each respective said plurality of post housings to thereby resiliently house each of said plurality of biased posts within each respective said plurality of post housings;
wherein each said threaded nut is located in proximity to a respective distal end of each respective said elongated threaded shaft and in between said respective distal end and an upper surface of each respective said plurality of post housings; and
wherein, when in use, said terminal block test adapter is adapted to be releasably attached to said terminal block via said two connector posts of said terminal block, said plurality of post housings adapted to be linearly aligned with post housings of said terminal block, and each said head of each respective plurality of biased posts are adapted to be in contact with a respective head of a respective post of each said post housing of said terminal block; and
wherein, when in use, each said proximal end of each said threaded bolt of said terminal block test adapter is adapted to be used for releasably connecting a test wire thereto for electrical testing purposes without breaking or shorting current flowing through said terminal block.

6. The combination of claim 5, wherein said main body further includes a hook portion on each opposite end thereof, each adapted to engage with a respective said connector post located on said spaced locations of said terminal block.

7. The combination of claim 5, wherein said main body of is formed from a non-conductive material.

8. The combination of claim 5, wherein said plurality of biased posts are formed from a conductive material.

9. The combination of claim 5, wherein said main body is formed having a substantially rectangular shape.

\* \* \* \* \*